(12) United States Patent
Nistler

(10) Patent No.: US 6,636,039 B1
(45) Date of Patent: Oct. 21, 2003

(54) RADIO-FREQUENCY ANTENNA FOR A MAGNETIC RESONANCE APPARATUS

(75) Inventor: Juergen Nistler, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/267,414

(22) Filed: Mar. 12, 1999

(30) Foreign Application Priority Data

Mar. 12, 1998 (DE) .......................................... 198 10 837

(51) Int. Cl.[7] .................................................. G01V 3/00
(52) U.S. Cl. ....................................................... 324/318
(58) Field of Search ............................... 324/318, 309, 324/322, 320, 307; 600/410

(56) References Cited

U.S. PATENT DOCUMENTS

| 4,439,733 A | * | 3/1984 | Hinshaw et al. ............ 324/322 |
| 4,506,224 A |   | 3/1985 | Krause ....................... 324/319 |
| 4,686,473 A | * | 8/1987 | Chesneau et al. ........... 324/320 |
| 4,797,617 A | * | 1/1989 | Misic et al. ................. 324/322 |
| 4,825,163 A |   | 4/1989 | Yabusaki et al. ............ 324/318 |
| 4,887,039 A | * | 12/1989 | Roemer et al. ............. 324/322 |
| 5,564,421 A | * | 10/1996 | Ehnholm .................... 600/410 |
| 6,020,740 A | * | 2/2000 | Renz et al. ................. 324/318 |
| 6,133,737 A | * | 10/2000 | Greim ....................... 324/318 |

FOREIGN PATENT DOCUMENTS

EP          0 498 571         8/1992

OTHER PUBLICATIONS

"Antennenbuch," 8th Revised Edition (1984) pp. 451–453 No Month.

* cited by examiner

*Primary Examiner*—Diego Gutierrez
*Assistant Examiner*—Tiffany A. Fetzner
(74) *Attorney, Agent, or Firm*—Schiff Hardin & Waite

(57) ABSTRACT

A radio-frequency antenna for a magnetic resonance apparatus has two antenna longitudinal conductors arranged opposite one another, two radio-frequency-shorted conductor loops that are respectively connected to the ends of the antenna longitudinal conductors, and an antenna return line that is planarly fashioned and electromagnetically coupled to the antenna longitudinal conductors and the conductor loops. A first signal terminal point is connected to the antenna return conductor. A second signal terminal location connected to one of the conductor loops is arranged such that an antenna impedance measured between the signal terminal locations is equal to a characteristic impedance of a signal line connectable thereat.

8 Claims, 3 Drawing Sheets

RADIO-FREQUENCY ANTENNA FOR A MAGNETIC RESONANCE APPARATUS

BACKGROUND OF THE INVENTION

1. Field of the Invention

The present invention is directed to a radio-frequency antenna for a magnetic resonance apparatus, particularly for a diagnostic magnetic resonance apparatus.

2. Description of the Prior Art

For example, U.S. Pat. No. 4,825,163 discloses a radio-frequency antenna for a diagnostic magnetic resonance apparatus. The circularly polarizing antenna disclosed therein is composed of two sub-systems arranged on a cylindrical generated surface and turned by 90° relative to one another. Each sub-system contains two antenna longitudinal conductors that are symmetrically arranged and axially directed with respect to the cylindrical generated surface. Neighboring antenna longitudinal conductors are connected to one another at their neighboring ends via resonance capacitors. Annular conductor loops (end rings) are arranged within the cylindrical generated surface and are capacitively coupled to the two ends of the two ends of the antenna longitudinal conductors. Each sub-system has a signal terminal that is connected to one of the end rings and one end of one of the antenna longitudinal conductors belonging to the sub-system.

A somewhat differently constructed circularly polarizing radio-frequency antenna is disclosed in U.S. Pat. No. 4,506,224. Similar to the antenna described above, four antenna longitudinal conductors are symmetrically arranged therein in the axial direction on a cylindrical generated surface. A radio-frequency shield surrounds the antenna longitudinal conductors. The ends of the antenna longitudinal conductors are connected via resonance capacitors to the radio-frequency shield, that additionally functions as a return conductor for the antenna longitudinal conductors.

The magnitude of the antenna impedance generally is approximately 400 Ω and thus differs from the characteristic impedance of a signal line to be connected that, for example, amounts to 50 Ω. Without impedance matching of the antenna to the signal line to be connected, undesired signal reflections would arise at the signal terminals. Signal matching circuits that are connected between the signal terminals and the signal lines are therefore utilized. The matching circuits transform the antenna impedance to the value of the characteristic impedance of the signal line to be connected. Changes in the impedance of the antenna due to different loads as a result of subjects under examination also can be compensated by using adjustable matching circuits. A reduction of the outlay for matching the antenna to the characteristic impedance of the signal line to be connected would be desirable.

It is stated on page 452 in the book by Karl Rothammel entitled "Antennenbuch", 1984, $8^{th}$ revised edition, Telekosmos-Verlag, Franckh'sche Verlagshandlung, Stuttgart, that all impedances from the highest value to the zero point occur given a shorted quarter-wave line ($\lambda/4$ line). This is utilized for the signal terminal to a dipole antenna with co-linear half-wave sections by finding the points on the conductor surface of the quarter-wave line that have an impedance corresponding to the characteristic impedance of the feed line (signal line).

European Application 0 498 571 discloses a radio-frequency antenna for a magnetic resonance apparatus that has a high-pass coil arrangement. The high-pass coil arrangement is surrounded by a radio-frequency shield. The coil arrangement has linear, conductive elements that extend in the axial direction and that are arranged with identical spacing from one another. The ends of the linear elements are connected to one another via circular conductors. This overall structure is also known as a birdcage resonator. Capacitances are inserted into the segments of the circular conductor for tuning.

SUMMARY OF THE INVENTION

An object of the present invention is to provide a radio-frequency antenna for a magnetic resonance apparatus having a signal terminal at which a signal cable can be connected with low-reflection.

This object is achieved in accordance with the invention by a radio-frequency antenna having two antenna longitudinal conductors arranged lying opposite one another and two conductor loops that are shorted in terms of radio-frequency that are respectively connected to ends of the antenna longitudinal conductors at the same side. An antenna return conductor is electromagnetically coupled to the antenna longitudinal conductors and the conductor loops. A first signal terminal location connected to the antenna return conductor and a second signal terminal location connected to one of the conductor loops are arranged such that an antenna impedance measurable over the signal terminal locations is equal to a characteristic impedance of a signal line connectable thereto. Given such an antenna structure, the current and voltage distribution which is present at the end rings is utilized to achieve the matching of the antenna impedance to the characteristic impedance of a connectable signal line without an additional matching circuit, or at most with a matching circuit having a reduced components outlay. The current and voltage distribution at the end rings occurs sinusoidally, with the current and voltage maxima being offset by 90° relative to one another in the ideal case. As a result, four locations exist at the end rings at which voltage and current are in such a relationship in terms of the magnitude of the impedance this magnitude, for example, being 50. When one of these locations is selected as second signal terminal location, then additional matching elements can be omitted.

The return conductor may be a curved, planar conductor, such as a conductive foil.

Overall, the offset second terminal location offers the advantage that the matching of the radio-frequency antenna can be set with a reduced components outlay in any case. At the same time, the voltage load on the employed component parts such as, for example, the lines, capacitors, coils and plugs is reduced.

DESCRIPTION OF THE PREFERRED EMBODIMENTS

Figure 1:
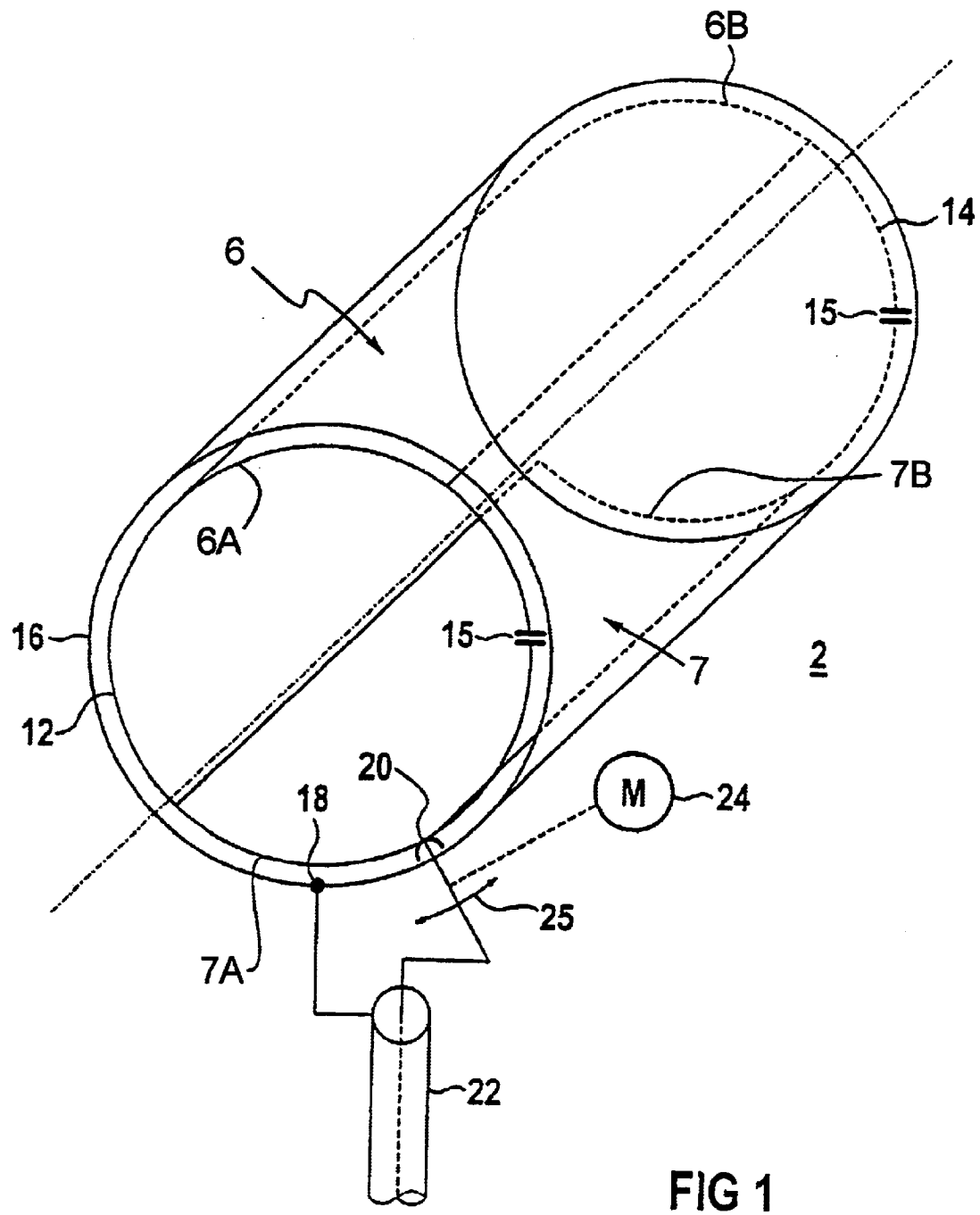
FIG. 1 is a perspective view of a first embodiment of an inventive radio-frequency antenna with a laterally offset and displaceable signal terminal location.

FIG. 1 shows a perspective view of a radio-frequency antenna 2 with two antenna longitudinal conductors 6 and 7 axially arranged on a cylindrical (imaginary) surface. The antenna longitudinal conductors 6, 7 are applied, for example, in planar fashion in the form of a copper foil on a motherboard (not shown). The antenna longitudinal conductors 6, 7 are identically fashioned and are arranged opposite one another on the cylindrical surface. The antenna longitudinal conductors 6, 7 are connected to one another via an annular conductor loop 12 at their ends 6A and 7A and by an annular conductor loop 14 at their ends 6B and 7B. The conductor loops 12, 14 are also referred to as end rings. Capacitors 15 that form a radio-frequency short, but which have a high impedance for low-frequency magnetic gradient fields, are connected in the conductor loops 12,14. The antenna longitudinal conductors 6, 7 and the conductor loops 12,14 are surrounded by a radio-frequency shield 16 that, in addition to shielding the radio-frequency fields toward the exterior, carries return currents (mirror currents) from the antenna longitudinal conductors 6, 7 and the conductor loops 12, 14, and is thus also referred to herein as an antenna return conductor.

A first signal terminal location 18 is connected to the radio-frequency shield 16. A second signal terminal location (tap) 20 is arranged on the conductor loop 12 offset relative to the first signal terminal location 18. The location of the second signal terminal 20 can be found, for example, using a network analyzer and is determined such that the antenna impedance measured across the signal terminal locations 18 and 20 is equal to the characteristic impedance of a signal line 22 to be connected.

The optimum location of the second signal terminal location 20 shifts dependent on the load "seen" by the antenna 2. In order to take this into consideration in selecting the location 20, the second signal terminal location 20 can be correspondingly adjusted in position by a motor drive 24, the movement being symbolized by the double arrow 25. To that end, the second signal terminal location 20 is fashioned as sliding contact on the conductor loop 12.

Figure 2:
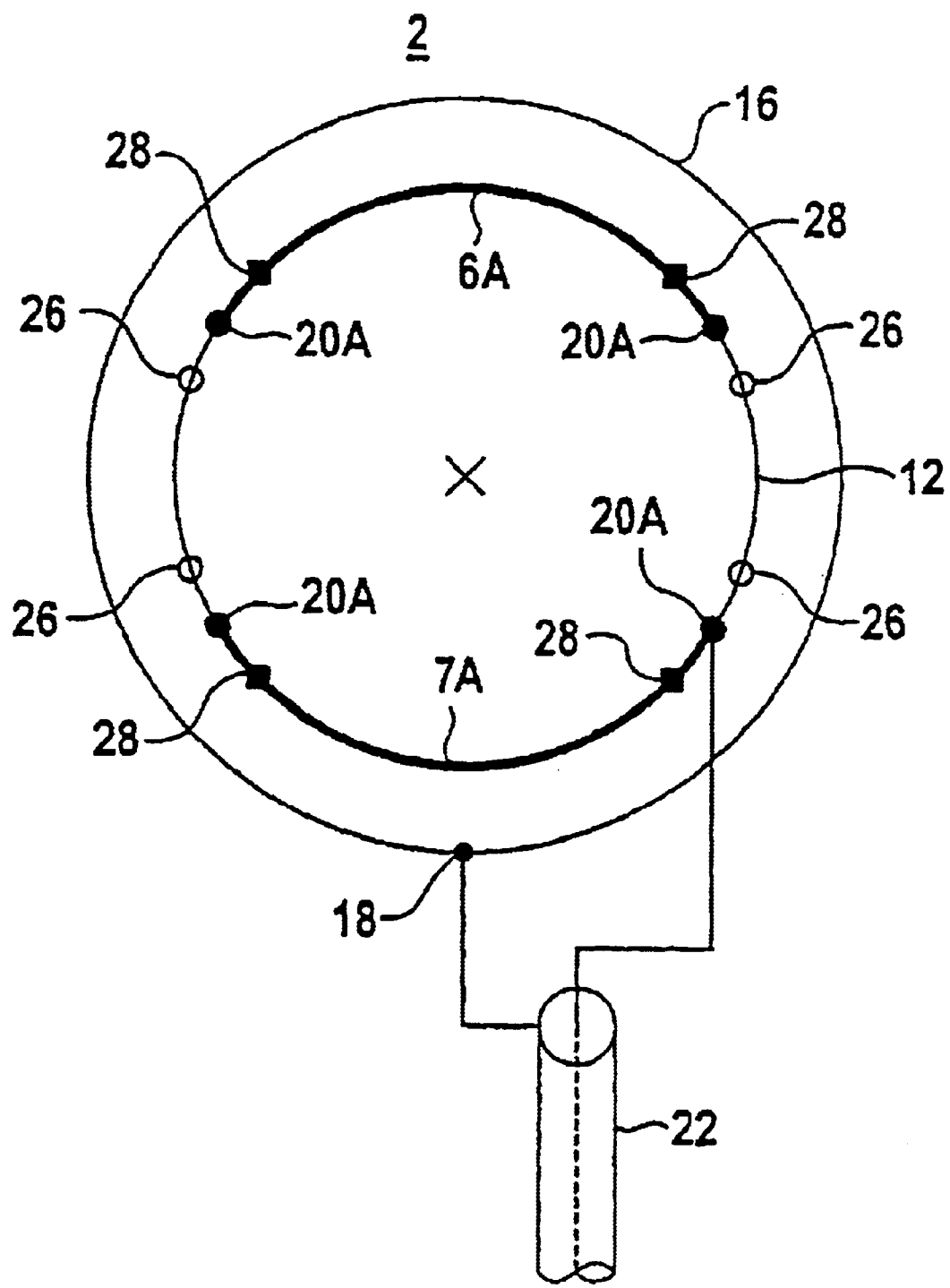
FIG. 2 is a schematic front view of a second embodiment of an inventive radio-frequency antenna with a laterally offset, fixed signal terminal location.

If one wishes to realize a fixed signal terminal location 20 that matches light as well as heavy loads on the antenna 2, a compromise must be made in the reflection factor. FIG. 2 shows these conditions in a schematic front view of the antenna 2 (without all components from FIG. 1 being included). The optimum locations at which the reflection factor disappears are identified by open circles 26 for a light load and by solid rectangles 28 for a heavy load. Fixed, second signal terminal locations 20A are arranged on the conductor loop 12 between these locations 26 and 28. The reflection factor which then occurs given light and heavy load is then less than 30% and therefore still can be tolerated in most cases.

Figure 3:
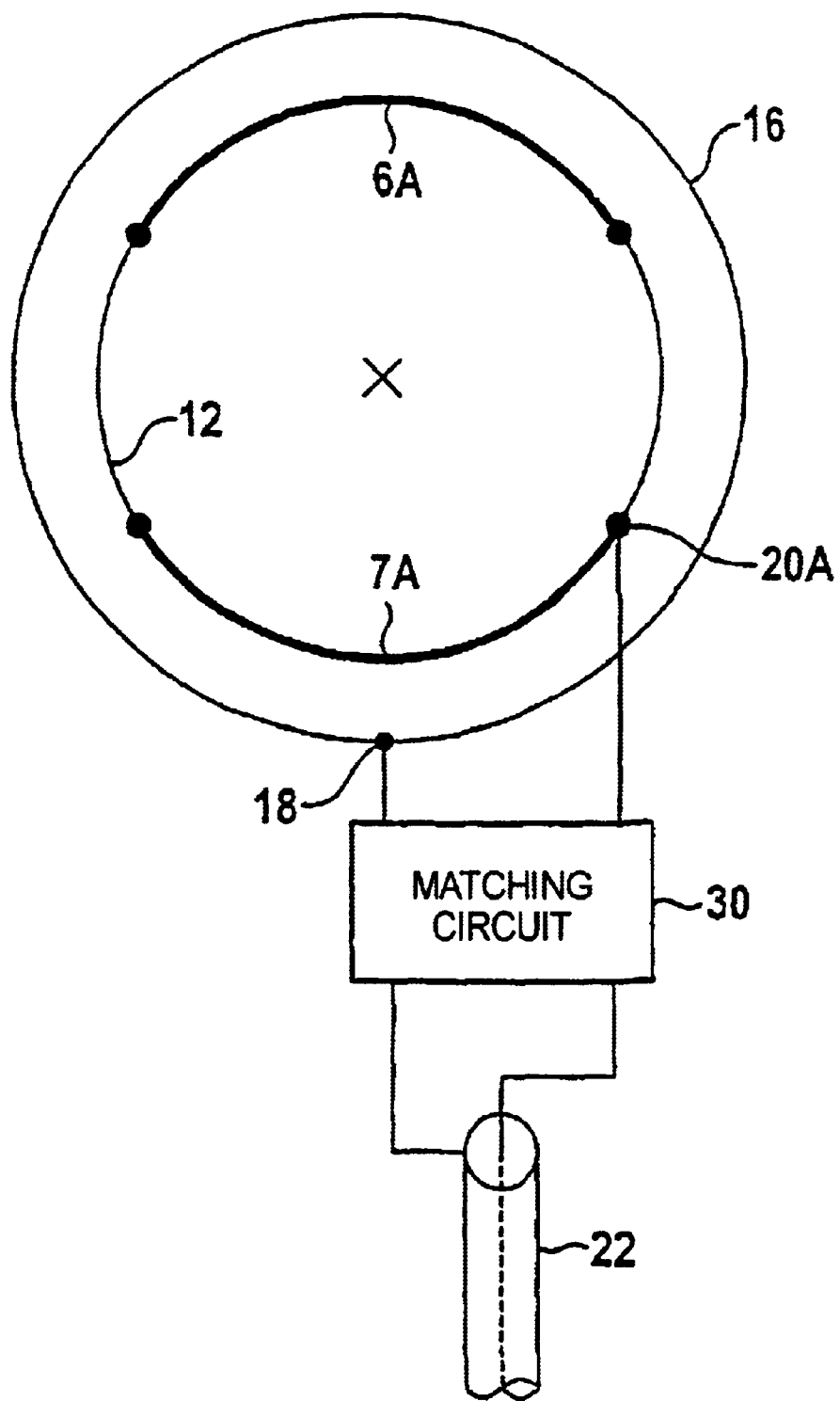
FIG. 3 is a schematic front view of a third embodiment of an inventive radio-frequency antenna with a laterally offset, fixed signal terminal location and a matching circuit for the compensation of load influences.

When a better matching, for example, a reflection factor of less than 5%, is desired, this can be achieved by a conventional, variable matching circuit 30, as shown in FIG. 3 (also a schematic illustration not intended to include all components from FIG. 1). The matching circuit is connected between the signal terminal locations 18 and 20A and the signal line 22. The advantage is achieved that the voltage load of the component parts of this circuit is lower by a factor of between 3 and 4 compared to a conventionally connected matching circuit.

If one is satisfied with a reflection factor of up to 10%, then a matching with, for example, a fixed capacitor and an additional, activatable capacitor already suffices.

Although modifications and changes may be suggested by those skilled in the art, it is the intention of the inventor to embody within the patent warranted hereon all changes and modifications as reasonably and properly come within the scope of his contribution to the art.

I claim as my invention:

1. A radio-frequency antenna for a magnetic resonance apparatus, said radio-frequency antenna having a longitudinal axis and comprising:

two longitudinal antenna conductors disposed opposite each other and substantially parallel to said longitudinal axis, each of said two longitudinal antenna conductors having a first end and a second end;

a first radio-frequency shorted conductor loop formed by a first conductor with a first capacitor connected therein, said first radio-frequency shorted conductor loop being electrically connected to the respective first ends of said two longitudinal antenna conductors, and a second radio-frequency shorted conductor loop formed by a second conductor with a second capacitor connected therein, said second radio-frequency shorted conductor loop being electrically connected to the respective second ends of said two longitudinal antenna conductors, said two longitudinal antenna conductors and said first and second shorted conductor loops forming a conductor configuration having an interior and an exterior;

a radio-frequency shield that is electromagnetically coupled to said two longitudinal antenna conductors and to said first and second conductor loops for shielding radio-frequency fields toward the exterior of said conductor configuration said radio-frequency shield having opposite shield ends respectively at said first conductor loop and said second conductor loop;

a first signal terminal node electrically connected to said radio-frequency shield at one of said shield ends; and a second signal terminal electrically connected at said one of said first and second conductor loops at said one of said shield end, said first signal terminal node and said second signal terminal having an impedance between said first signal terminal node and said second signal terminal which is substantially equal to a characteristic impedance of a signal line connectable across said first signal terminal node and said second signal terminal.

2. A radio-frequency antenna as claimed in claim 1 wherein said two longitudinal antenna conductors are substantially identical to each other.

3. A radio-frequency antenna as claimed in claim 1 wherein said first and second conductor loops are substantially identical to each other.

4. A radio-frequency antenna as claimed in claim 1 wherein said first conductor loop comprises a first circular ring and wherein said second conductor loop comprises a second circular ring.

5. A radio-frequency antenna as claimed in claim 4 wherein said first and second conductor loops define a first cylindrical generated surface, having a first diameter, and wherein said two longitudinal antenna conductors are disposed on said first cylindrical generated surface, and wherein said antenna return conductor is disposed on a second cylindrical generated surface having a second diameter which is different from said first diameter.

6. A radio-frequency antenna as claimed in claim 5 wherein said return conductor comprises a planar conductor curved around said second cylindrical generated surface.

7. A radio-frequency antenna as claimed in claim 1 wherein said second signal terminal comprises a fixed terminal on said one of said first and second conductor loops at a distance from said first signal terminal node for producing an impedance between said first signal terminal node and said fixed terminal with a reflection factor of less than about 30%.

8. A radio-frequency antenna as claimed in claim 1 wherein said second signal terminal comprises a displaceable terminal, relative to said first signal node, movable around said one of said first and second conductor loops.

\* \* \* \* \*